United States Patent [19]
Shin et al.

[11] Patent Number: 5,310,720
[45] Date of Patent: May 10, 1994

[54] PROCESS FOR FABRICATING AN INTEGRATED CIRCUIT DEVICE BY FORMING A PLANARIZED POLYSILAZANE LAYER AND OXIDIZING TO FORM OXIDE LAYER

[75] Inventors: Daitei Shin, Kawasaki; Hideki Harada, Kagoshima, both of Japan

[73] Assignees: Fujitsu Limited, Kanagawa; Kyushu Fujitsu Electronics Limited, Kagoshima, both of Japan

[21] Appl. No.: 21,573

[22] Filed: Feb. 24, 1993

[30] Foreign Application Priority Data

Feb. 28, 1992 [JP] Japan ............... 4-042770

[51] Int. Cl.$^5$ ............... H01L 21/302
[52] U.S. Cl. ............... 437/231; 437/235; 437/238; 427/344; 427/387; 427/397.7
[58] Field of Search ............... 437/231, 238, 235, 241; 427/344, 374.6, 387, 397.7

[56] References Cited

U.S. PATENT DOCUMENTS

| | | | |
|---|---|---|---|
| 3,962,004 | 6/1976 | Sonneborn | 156/11 |
| 4,103,045 | 7/1978 | Lesaicherre et al. | 427/82 |
| 4,519,872 | 5/1985 | Anderson, Jr. et al. | 156/643 |
| 4,599,243 | 7/1986 | Sachder et al. | 427/38 |
| 4,707,218 | 11/1987 | Giammario et al. | 156/643 |
| 4,784,975 | 11/1988 | Hoffman et al. | 437/247 |

FOREIGN PATENT DOCUMENTS 2289415 11/1990 Japan ............... 437/228
4176123  6/1992 Japan ............... 437/228

OTHER PUBLICATIONS

Stanley Wolf, Silicon Processing for the VLS, ERA, vol. 2, Lattice Press, Sunset Beach, Calif., 1990, pp. 194–198, 211–212.

David S. Ballance et al., "Low Temperature Reflow Planarization Using A Novel Spin-On Interlevel Dielectric", Jun. 9–10, 1992, VMIC Conference, pp. 180–186.

H. Kotani et al., "An Advanced Multilevel Interconnection Technology For 0.4-μm High Performance Devices", Jun. 9–10, 1992, VMIC Conference, pp. 15–21.

Primary Examiner—Olik Chaudhuri
Assistant Examiner—Ken Horton
Attorney, Agent, or Firm—Armstrong, Westerman, Hattori, McLeland & Naughton

[57] ABSTRACT

A thick planarization layer of silicon dioxide that is heat resistant is provided by coating a polysilazane layer over a substrate having steps and firing the polysilazane layer in an oxygen-containing atmosphere to convert the polysilazane to silicon dioxide. The temperature of this conversion may be as low as 400° to 450° C. while a higher firing or curing temperature is preferable to obtain a more densified oxide layer.

10 Claims, 4 Drawing Sheets

PROCESS FOR FABRICATING AN INTEGRATED CIRCUIT DEVICE BY FORMING A PLANARIZED POLYSILAZANE LAYER AND OXIDIZING TO FORM OXIDE LAYER

BACKGROUND OF THE INVENTION

(1) Field of the Invention

The present invetion relates to a process for fabricating an integrated circuit device, which includes planarizing steps, such as bulk steps because of electrodes, element isolations, etc. or other steps such as wiring steps.

(2) Description of the Related Art

As the integration and miniaturization of intergrated circuit devices such as semiconductor intergrated circuit progress, the formation of fine multi-layer wiring layers are required on the surface of the intergrated circuit devices and as much planarization of the bulk steps underlying the multi-layer wiring layers as possible is desired. The term "bulk step" used here means steps formed on the surface of an intergrated circuit device, for example, by polysilicon electrodes or by element isolations of LOCOS oxides, etc., before the formation of metal wiring layers.

Although a high temperature treatment at a temperature higher than 550° C. can be applied before the formation of metal layers, such a high temperature treatment cannot be used after the formation of a metal layer, e.g., an aluminum layer, since the metal wiring layer may be oxidized or fused.

To meet with the above demands, inorganic SOG (spin on glass) processes, organic SOG (spin on glass) processes, reflow processes of BPSG (borophosphosilicate glass) or other processes for planarization are utilized to fill or planarize steps including the bulk steps or other steps formed after bulk formation by metal wiring layers or the like.

Nevertheless, it is difficult to effectively reduce the above bulk steps by conventional planalization processes.

In the inorganic SOG process, it is difficult to form a thick layer without cracks. Accordingly, planalization of large steps is impossible, because in the inorganic SOG process, tetrasianol $Si(OH)_4$ is dehydration condensed to form $(-SiO_2-)_n$, during which the volume of the coated SOG layer is reduced significantly and, if the layer is thick, cracks are formed.

In the organic SOG process, a reduction of the volume of the layer is less or the volume is increased during the condensation of an organic silanol because organic groups remain. Accordingly, it is possible to form a thick layer without cracks. Nevertheless, the organic SOG layer is not heat resistant and therefore cannot be used for a bulk involving a high temperature treatment, particularly above 550° C. If a device is heat treated, particularly at a temperature above 550° C., after the organic SOG layer is made, the organic groups leave the layer and pores appear.

In the reflow process using BPSG, the reflowing a high purity BPSG requires a high temperature treatment of at least 850° C., at which temperature borons introduced in a semiconductor substrate move to vary the doped impurity distribution and cause damage to a shallow junction, etc. Accordingly, the utilization of this reflow process is limited.

Further, a combination of an inorganic SOG layer and an underlying PSG (phospho-silicate glass) or BPSG layer and a combination of an inorganic SOG layer with an underlying CVD-$SiO_2$ layer and a top PSG layer, so as to obtain a thick insulating layer are known. Nevertheless, in these combinations, the degree of planarization is insufficient because the inorganic SOG layer acting as the main planarizing layer is thin. Furthermore, these processes are complex and are low in productivity.

Therefore, the object of the present invention is to provive a process for planarizing an integrated circuit device which allows effective planarization of bulk steps derived from electrodes, element isolations, etc. and other steps derived from metal wiring layers, etc.

SUMMARY OF THE INVENTION

To attain the above object of the present invention, in a process for fabricating an integrated circuit device, such as a semiconductor integrated circuit device, the present invention comprises the step of planarization by coating a polysilazane onto a surface of a substrate having a step and curing or oxidizing the coated polysilazane to obtain a planarization layer of silicon dioxide.

It is preferred that the polysilazane be annealed at a temperature of not less than 550° C. to obtain a further densified oxide planarizing layer.

Optionally, a top portion of the coated polysilazane or the silicon dioxide planarization layer may be removed so that only the rest portion of the coated polysilazane or the silicon dioxide planarization layer contributing to the planarization remains.

The silicon dioxide layer derived from a coated polysilazane layer may also be utilized as a protecting layer of an integrated circuit device.

Thus, in accordance with the present invention, there are also provided an integrated curcuit device comprising a substrate having a bulk step and a planalization layer derived from the polysilazane and an integrated curcuit device comprising a substrate and a protecting layer derived from the polysilazane.

In accordance with the present invention, the used polysilazane can be thinly coated on a top portion of a step and thickly coated on a recessed portion of a step, as an inorganic SOG layer, and can provide a thick planarization layer of silicon dioxide without cracks. As a result, the degree of planality of the planarization layer in the steps can be improved in comparison with the conventional processes and therefore short circuits of post formed wiring layers are prevented and patterning of a resist becomes easy, thereby enlarging the margin of design and fabrication process conditions of integrarted circuit devices.

Generally speaking, in the conventional inorganic SOG process, the obtainable planarization layer resistant to a temperature of about 450° C. can have a thickness of, at most, 500 to 600 nm, on silicon or, at most, 200 nm on aluminum. In contrast, in accordance with the present invention, the obtainable planarization layer can have a thickness of up to 1.5 to 2.0 µm on silicon or up to 500 to 600 nm on aluminum. Such a thick planarization layer of the present invention can be obtained by curing or firing at a temperature of, for example, about 450° C.

The reasons for the above are that a polysilazane typically represented by the formula $(-SiH_2NH-)_n$ is cured and oxidized by releasing hydrogen and nitrogen atoms and absorbing oxygen atoms to form silicon dioxide, SiO$_2$, and accordingly, the change in volume of the polysilazane to the silicon dioxide is small, which allows a thick silicon dioxide layer to be formed without cracks. In practice, one example of polysilazanes exhibited volume shrinkage of about 12 to 16% when oxidized. It should be noted that the volume change is determined not only by the change of the constituent atoms of the molecules but also by the structure or density of the molecules present in the coated layer.

It is possible, depending on the starting polymer or process conditions or other factors, that a trace amount of nitrogen atoms may remain in the oxidized layer, although it is usually very small, far less than 1% by weight, or it can be made zero, if desired. If nitrogen atoms remain, ammonia gas derived from the nitrogen atoms may be released from the planarization layer during the post heat treatment if said curing conditions are inadequate. The ammonia gas may corrode metal layers such as an aluminum layer.

The above disadvantages can be alleviated by selectively removing a portion of the silicon dioxide layer formed above the top of the steps which does not contribute to planalization, bacause the amount of ammonia produced is reduced thereby. By this partial removal of the silicon dioxide layer, the surface area of the silicon dioxide layer in contact with an overlying or underlying CVD layer is reduced so that adherence between the layers is improved. Instead of the silicon dioxide layer, a portion of the polisilazane layer formed on top of the steps which does not contribute to planalization may be selectively removed.

The polysilazane used in the present invention is a polymer containing Si—N bonds in the molecule and preferably does not contain hydroxide or Oxygen in the molecule. A polysilazane having a repeating unit of —SiH$_2$NH— whose ends are silylated by hexamethyldisilazane is preferred.

A polysilazane is typically produced by reacting a halosilane, H$_n$SiX$_{4-n}$, where X is a halogen atom such as chlorine and n is 0, 1, 2 or 3, or an organohalosilane, R$_m$H$_n$SiX$_{4-n-m}$, where X is a halogen atom such as chlorine, n and m are integers and (n+m) is 0, 1, 2 or 3, with an amine.

The polysilazane is coated, typically spin-coated on a substrate or a bulk having a step, such as a bulk step, to make the coated layer planar. The coating solution preferably uses xylene as a solvent. The conditions of spin coating a polysilazane solution can be easily considered from those of an inorganic SOG.

The curing or firing or heat treatment of the coated polysilazane layer is performed in an oxygen-containing atmosphere, for example, an oxygen atmosphere or a humid (water steam) atmosphere. The temperature is for example 350° to 450° C., preferably 400° to 450° C., if the polysilazane layer is present over alumimum. The temperature may be higher than 450° C., for example, 950° C., if allowed by the substrate. Firing or annealing at a higher temperature is preferable if allowed by the device, since a higher temperature firing or curing provides a more densified silicon dioxide layer. However, it should be noted that the present invention does not necessarily require such a higher temperature. A plasma atmosphere may be also used.

The planarization layer of silicon dioxide derived from polysilazane may be combined with a PSG or BPSG layer and/or a CVD-SiO, layer, if desired. The method of these combinations may be similar to those of conventional combinations of the inorganic SOG layer.

The silicon dioxide layer derived from a polysilazane can be used not only as a planalization layer but also as a protecting layer of semiconductor devices or integrated circuit devices. Conventionally, a protecting layer is typically a PSG layer or a protecting layer is not present.

Thus, there is also provided an integrated curcuit device comprising a protecting layer of silicon dioxide derived from the polysilazane.

DETAILED DESCRIPTION OF THE INVENTION

Embodiments of the present invetion are now described with referenece to the drawings.

Figure 1A:
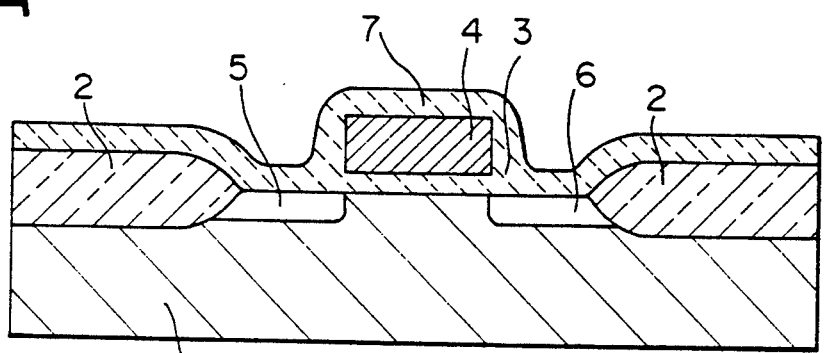
FIGS. 1A to 1C show sectional views of a semiconductor integrated circuit device during the main fabricating steps in the first embodiment of the present invention.
Figure 1B:
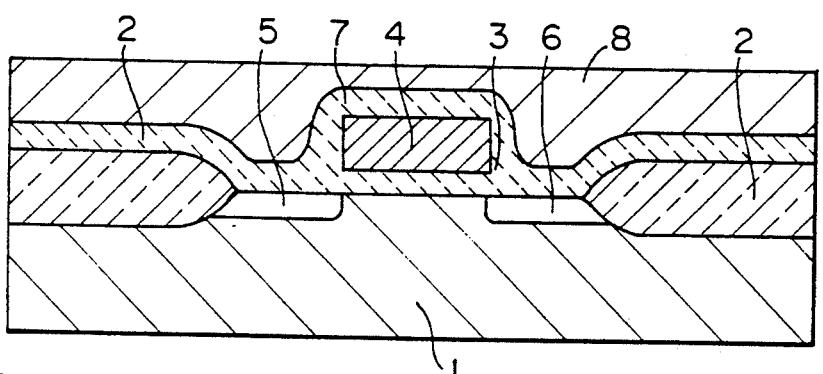
Figure 1C:
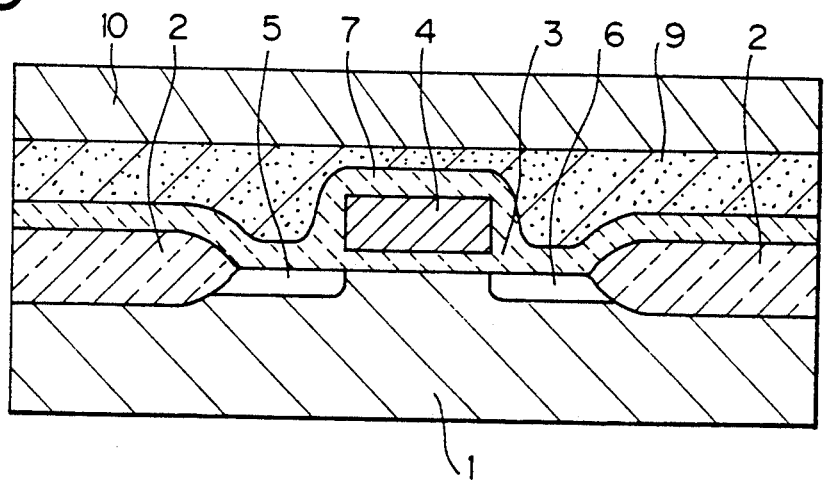

FIGS. 1A to 1C show the first embodiment of the present invention, in which 1 denotes a semiconductor substrate or wafer, 2 a LOCOS oxide layer, 3 a gate insulating layer, 4 a gate layer, 5 a source region, 6 a drain region, 7 a CVD-SiO$_2$ layer, 8 a polysilazane layer, 9 a silicon dioxide layer and 10 a BPSG layer.

Referring to FIG. 1A, on a semiconductor substrate 1, a LOCOS oxide layer 2 for element isolation having a thickness of about 300 nm, a gate insulating layer 3 and a gate electrode 4 having a thickness of about 400 nm are formed. Source and drain regions 5 and 6 are then formed in self-alignment with the gate electrode 4. A CVD-SiO layer 7 is then deposited entirely over the bulk wafer.

Referring to FIG. 1B, a polysilazane solution in an organic solvent is spin-coated on the surface, having steps, of the CVD-SiO layer 7 formed on the bulk wafer in a thickness of about 800 nm, which is then baked at 200° C. for about 3 minutes to remove the organic solvent and obtain a solid polysilaxane layer 8. The obtained polysilaxane layer 8 has a planar or flat top surface.

Here, the used polysilazane is a perhydropolysilazane having the formula of (—SiH$_a$NH$_b$—)n, where a is 1, 2 or 3 and b is 0 or 1, and terminated with hexamethldisilazane:—NCH$_3$Si(CH$_2$) $_3$NCH$_3$Si(CH$_3$)$_3$.

The banked poly-silazane layer 8 is then fired in a wet oxygen atmosphere (7.5 l/min H$_2$ and 5 l/min O$_2$ which are converted to 14.3% O$_2$ and 85.7% H$_2$O) at 450° C. for 30 minutes to convert the poly-silazane layer to a silicon dioxide layer (SiO$_2$ with a minor SiON) 9. The silicon dioxide layer 9 also has a planar or flat surface.

If the thus obtained silicon dioxide layer 9 is further heat treated in an oxygen-containing atmosphere at about 800° C. for 30 minutes, the obtained silicon dioxide layer 9 is densified significantly.

Referring to FIG. 1C, a BPSG layer 10 having a thickness of about 500 to 600 nm is deposited on the silicon dioxide layer 9 by CVD. The BPSG layer 10 has an etching rate slightly lower than that of the silicon dioxide layer 9 derived from the poly-silazane and therefore can prevent the silicon dioxide layer 9 from being etched and a step deepened when forming an overlying metal wiring layer.

In accordance with this embodiment of the present invention, without deteriorating the characteristics of integrated circuit devices, steps such as electrode steps or element isolation steps can be easily planarized and step coverage of the overlying wiring layer is improved, which allows the enlargement of margin for formation of wiring layers, virs, etc.

FIGS. 2A to 2E show the second embodiment of the present invention, in which 11 denotes a semiconductor substrate or wafer, 12 a first wiring layer, 13 a P—SiO$_2$ layer (a plasma enhanced SiO$_2$ layer), 14 a PSG or SiO$_2$ layer, 15 a polysilazane layer, 16 a silicon dioxide layer, 17 a via and 18 a second wiring layer.

Figure 2A:
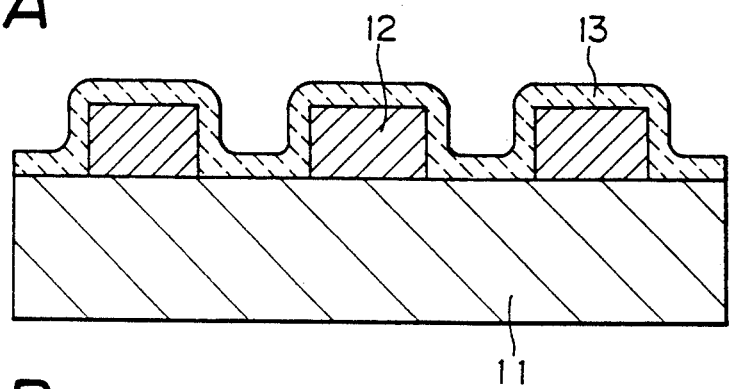
FIGS. 2A to 2E show sectional views of a semiconductor integrated device during main fabricating steps in the second embodiment of the present invention.

Referring to FIG. 2A, a first wiring layer 12 of aluminum, etc., is formed on a semiconductor substrate 11 and a P—SiO$_2$ layer 13 having a thickness of about 300 nm is then deposited by plasm CVD.

Figure 2B:
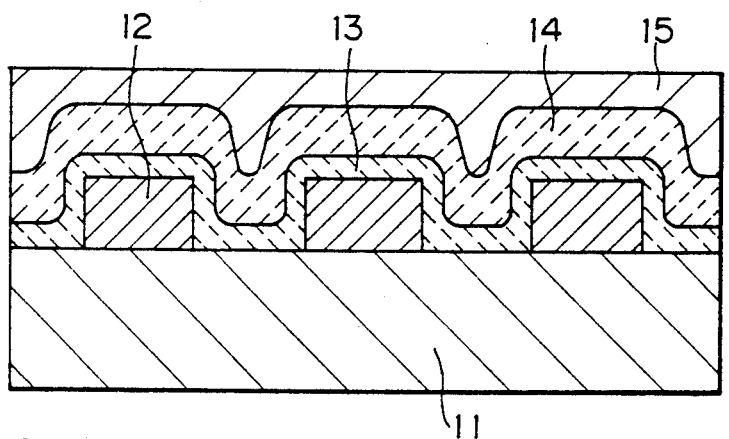

Referring to FIG. 2B, a PSG or SiO$_2$ layer 14 having a thickness of about 500 nm is deposited over the P—SiO$_2$ layer 13 by a low temperature CVD. A polysilazane layer 15 having a thickness of about 800 nm is then coated over the PSG or SiO$_2$ layer 14. The top surface of the polysilazane layer 15 is planar or flat.

Figure 2C:
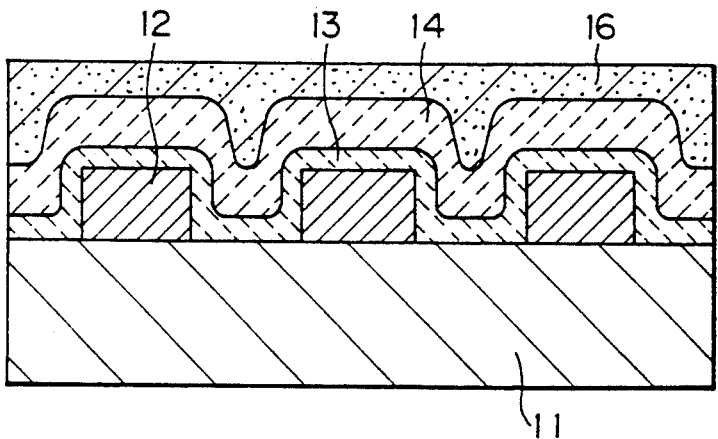

Referring to FIG. 2C, the polysilaxane layer 15 is then baked at about 200° C. for about 3 minutes and fired in a wet oxygen atmosphere at 450° C. for 30 minutes to convert the polysilaxane layer to a silicon dioxide layer (SiO$_2$ with a minor SiON) 16. The silicon dioxide layer 16 also has a planar or flat surface. In this case, the firing or curing of the polysilazane layer 16 cannot be performed at a temperature higher than about 500° C., considering the melting point of the metal layer 12 of Al or an Al alloy which has been formed before coating the polysilazane layer 16.

Figure 2D:
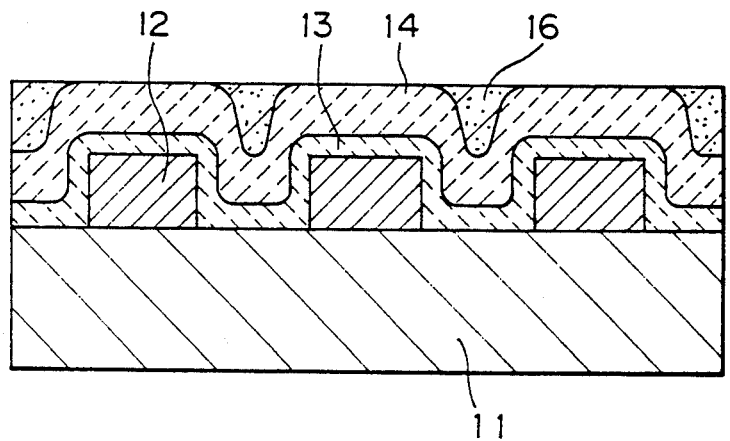

Referring to FIG. 2D, a portion of the silicon dioxide layer 16 formed over the top of the steps is removed by reactive ion etching under the conditions of flow rates of CF$_4$ 50 sccm and CHF$_3$ 50 sccm, a pressure of 0.15 torr and a power of 450W.

The reactive ion etching (RIE) is preferably continued as long as the planar surface remains. When a first wiring layer with an aspect ratio of 1, a width of 1 μm and a space of 1 μm (a pitch of 2 μm) is formed, a one minute RIE treatment is adequate. Here, the etching rate of the silicon dioxide layer 16 derived from the polysilazane was 200 nm/min.

After the RIE, the top of the steps, i.e., the PSG or SiO$_2$ layer 14 will be exposed. The top surface of the thus treated or etched portion is still planar and the silicon dioxide layer 16 fills the recess portions of the steps.

Figure 2E:
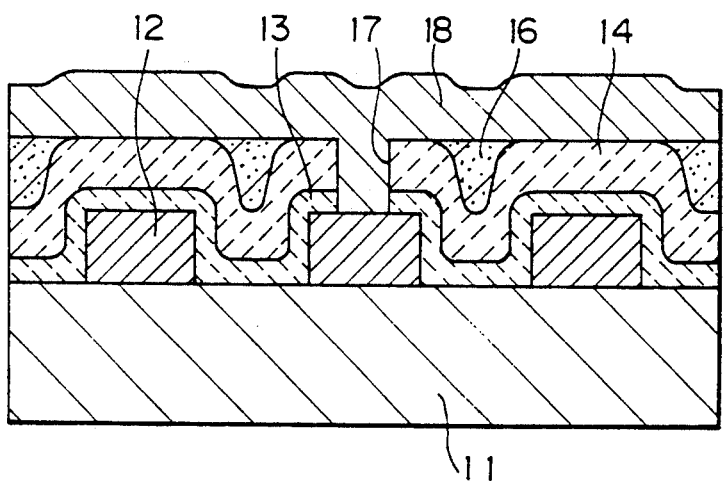

Referring to FIG. 2E, a via 17 is formed and a second wiring layer 18 of aluminum, etc. is then formed.

Although a portion of the silicon dioxide layer 16 over the top of the steps is etched back in the above example, a portion of the polysilazane layer 15 over the top of the steps may be etched back before the oxidation of the polysilazane layer 15.

In the above embodiment, the steps, more specifically, the recess portions are filled with the silicon dioxide layer derived from the polysilazane and a portion of the silicon dioxide layer over the steps is removed. Accordingly, adherence between CVD layers 14 and 16 is improved and since the metal layer 18 contacts the silicon layer 16 in a reduced area, corrosion by ammonia, which may be formed during a post heat treatment from nitrogen remaining in the layer 16 due to insufficient firing or annealing of the polysilazane layer 15, can be alleviated.

In this embodiment, since the polysilazane layer is formed as a thicker layer in comparison with the conventional inorganic SOG layer, the planarity is sufficiently maintained even if the portion of the silicon dioxide layer over the top of the steps is removed.

Also, it is easy to remove the portion of the silicon dioxide layer over the top of the steps since no mask is used during the etch back of the silicon dioxide layer.

In accordance with the present invention, as describe above, without deteriorating the characteristics of integrated circuit devices, steps such as electrode steps or element isolation steps can be easily planarized and step coverage of the overlying wiring layer is improved, which allows improvement of the step coverage of an overlying wiring layer to almost 100% and enlargement of margin for formation of wiring layers, vias, etc.

Figure 3:
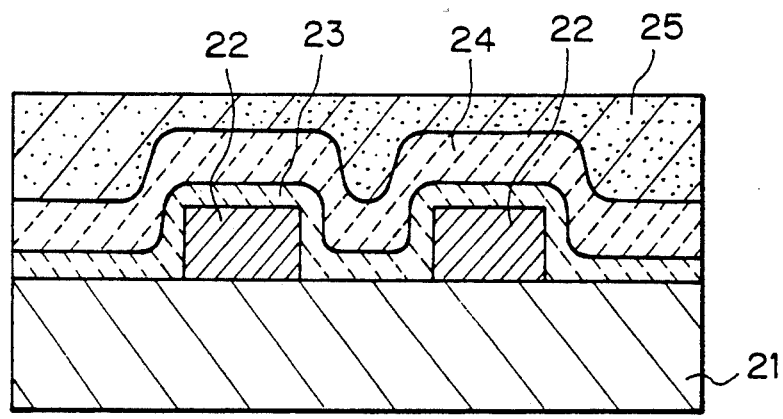
FIG. 3 shows a sectional view of an example of a semiconductor integrated device in which a silicon dioxide layer derived from polysilazane is used as a protecting layer.

FIG. 3 shows an example of a semiconductor device, in which a silicon dioxide layer derived from a polysilazane layer is used as a protecting layer. In FIG. 3, 21 denotes a bulk substrate, 22 an uppermost wiring layer 200 nm thick, 23 a PSG layer 500 nm thick and 24 a P-SiN layer. Usually, the PSG layer 23 and the p—SiN layer 24 constitute a passivation or surface protecting layer. In the present invention, a silicon silicon dioxide layer 25 derived from a polysilazane layer further covers on the P—SiN layer 24 as an important passivation or surface protecting layer.

We claim:

1. A process for fabricating an integrated circuit device, which comprises:
   preparing an integrated circuit device comprising a substrate having a stepped portion on an upper surface thereof;
   coating a polysilazane on the upper surface of said substrate to form a polysilazane layer having a planar top surface; and
   firing the polysilazane layer in an oxygen-containing atmosphere to convert the polysilazane layer to a silicone dioxide layer, wherein the silicon dioxide layer has a planar top surface and covers the upper surface of the substrate including the stepped portion thereon.

2. A process according to claim 1, wherein firing is at a temperature of not less than 550° C.

3. A process according to claim 1, wherein after firing, the silicon dioxide layer is further annealed at a temperature of not less than 550° C. to densify the silicone dioxide layer.

4. A process according to claim 1, further comprising removing a portion of the silicon dioxide layer above said stepped portion.

5. A process according to claim 1, wherein a portion of the polysilazane layer above the stepped portion is removed prior to firing.

6. A process according to claim 1, wherein a phosphosilicate glass layer is deposited over the upper surface of the substrate having a stepped portion thereon prior to coating with the polysilazane.

7. A process according to claim 6, wherein said phosphosilicate glass layer is subjected to a reflow process.

8. A process according to claim 1, wherein an SiO$_2$ layer is deposited over the upper surface of the substrate by CVD, and after firing, a phosphosilicate glass layer is deposited over the silicon dioxide layer obtained by firing the polysilazane layer.

9. A process according to claim 1, wherein the integrated circuit device is a semiconductor substrate.

10. A process according to claim 1, wherein the polysilazane is a perhydropolysilazane.

* * * * *